United States Patent [19]

Ulriksson et al.

[11] Patent Number: 4,682,060

[45] Date of Patent: Jul. 21, 1987

[54] NOISE SUPPRESSION IN AN I-F SUBSTITUTION LOOP

[75] Inventors: Bengt A. Ulriksson, Gaithersburg; Lawrence Fletcher, Frederick, both of Md.

[73] Assignee: Weinschel Engineering Co., Inc., Gaithersburg, Md.

[21] Appl. No.: 708,494

[22] Filed: Mar. 5, 1985

[51] Int. Cl.$^4$ .......................... H03B 3/04; H04B 1/10
[52] U.S. Cl. .................................... 307/543; 307/546; 307/556; 328/138; 328/167; 455/63
[58] Field of Search ............... 307/542, 543, 546, 556; 328/138, 167; 455/63, 50, 135, 296, 307, 312, 310; 324/58 A

[56] References Cited

U.S. PATENT DOCUMENTS

| 3,621,407 | 11/1971 | Kerwin et al. | 328/167 |
| 4,189,681 | 2/1980 | Lawson et al. | 330/109 |
| 4,219,770 | 8/1980 | Weinert | 324/58 A |
| 4,292,468 | 9/1981 | Yokoyama | 333/214 |
| 4,328,591 | 5/1982 | Baghdady | 328/165 |

Primary Examiner—Stanley D. Miller
Assistant Examiner—Richard Roseen
Attorney, Agent, or Firm—Hall, Myers & Rose

[57] ABSTRACT

In an I-F substitution loop having a summing junction for receiving both an I-F signal and a substitution signal, an amplification loop is connected in parallel with the substitution loop for amplifying and bandpass filtering the signal at the summing junction, and feeding back to the summing junction the processed summing junction signal, for reducing the phase noise at the summing junction.

6 Claims, 9 Drawing Figures

NOISE SUPPRESSION IN AN I-F SUBSTITUTION LOOP

BACKGROUND OF THE INVENTION

1. Field of the Invention

The field of the present invention relates generally to I-F substitution loops for accurately measuring I-F signal levels, and more particularly relates to circuitry for reducing the phase noise occurring at the main summing junction of the substitution loop.

2. Discussion of the Relevant Art

Signal generator calibrators, such as the VM-24 manufactured by Weinschel Engineering Incorporated, USA, are used for measuring the amplitude of low level signals. The VM-24 signal generator calibrator includes a phase lock loop locked to a local oscillator for translating the input signal to be measured to a predetermined I-F frequency, and an I-F substitution loop for accurately measuring the level of the I-F signal. The range of measurement of the calibrator is limited by noise that may be inherent in the I-F signal. Accordingly, reductions in the noise within the I-F substitution loop offers extended low-level detection capability for the signal generator calibrator.

Many attempts have been made in the prior art to reduce the level of the noise occurring in electronic circuitry. For example, in Kerwin, et al U.S. Pat. No. 3,621,407 VARIOUS MULTI-LOOP RC active filter networks are disclosed for producing transfer functions having complex poles and/or zeros via use of at least two passive components and two voltage amplifiers, one having a positive gain which is less than unity and the other having a negative gain. In one embodiment shown in FIG. 10 of Kerwin, et al, a voltage amplifier having a positive gain $K_1$ has an input terminal connected to a summing junction of a second voltage amplifier having a negative gain of magnitude $K_2$, with the output of the positive gain amplifier 56 being fed back, via a passive element including an RC coupling network, to the summing junction, and with the output of the negative gain amplifier 54 being fed back to the summing junction through a distributed resistor of the passive element that is common to the coupling capacitor of the element connected to the output of the positive gain amplifier 56. The input signal is coupled via distributed capacitance of the passive element to the distributed resistor of the coupling to the summing junction. The circuitry provides a multi loop transfer function generating apparatus using the passive element of distributed active RC elements for providing a zero, at zero frequency, without requiring the use of a differential amplifier.

Nelson, et al U.S. Pat. No. 4,189,681, discloses an active filter in which two, second-order, multiple-feedback, active filter circuits are cascaded and the output of the second filter is fed back to the input of the first filter to realize a fourth-order filter for greatly attenuating signals outside the passband, while passing signals with very low phase shifting thereof that are within the passband.

Yokoyama U.S. Pat. No. 4,292,468, discloses a frequency selection circuit generally including an operational amplifier connected to receive an input signal at its non-inverting input terminal, a band rejection filter connected to an output terminal of the amplifier, a feedback resistor connected between the output terminal of the amplifier and its non inverting input terminal, and the output of the band rejection filter or bandpass filter being connected to a voltage follower amplifier, the output of the latter being connected, via feedback resistors, to both the inverting and non-inverting terminals of the operational amplifier. The circuit is equivalent to an LCR series resonant circuit, although not provided with inductance, the circuit can adjust resonant frequency, selectivity or quality factor Q, and circuit impedance at resonance, by varying the resistance in the circuit only.

A typical I-F substitution loop is disclosed in U.S. Pat. No. 4,219,770 which relates to insertion loss and a method of phase shift measurement.

SUMMARY OF THE INVENTION

Various circuitry available in the art for providing active filtering, and/or passive filtering, are either inadequate or uneconomic for use in extending the dynamic range of the previously mentioned VM-24 signal generator calibrator. It was discovered that the major problem to be solved for extending the dynamic range of the instrument is to reduce the noise in the phase lock loop where white noise is converted into phase noise in the phase detector of the loop. The phase noise was found to cause compression in a synchronous detector of the I-F substitution loop used in the signal generator calibrator.

Accordingly, one object of the invention is to decrease the phase noise in the I-F substitution loop of the signal generator calibrator.

Another object of the invention is to decrease the phase noise in the I-F substitution loop, while permitting the I-F signal to pass substantially unaltered for accurate measurement or the level thereof.

These and other objects were met by providing a second loop in the I-F substitution loop, wherein the second loop includes an amplifier providing bandpass filtering and amplification of the signal at the summing junction of the I-F substitution loop, for feeding this amplified and bandpassed signal back to the summing junction to substantially reduce phase noise existing at the summing junction.

BRIEF DESCRIPTION OF THE DRAWINGS

In the drawings, wherein like elements are shown by the same reference number.

DESCRIPTION OF THE PREFERRED EMBODIMENTS

Figure 1:
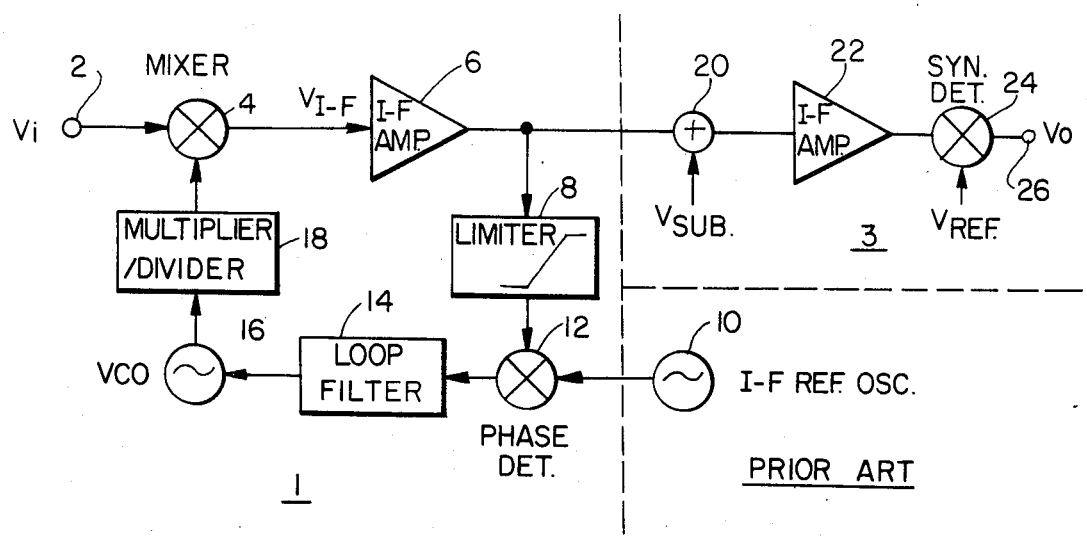
FIG. 1 shows a block schematic diagram of the VM-24 signal generator calibrator without use of the present invention.

In FIG. 1, the VM-24 signal generator calibrator previously mentioned, is shown to include two basic subsystems, a phase lock loop 1, and an I-F substitution loop 3. As shown, the phase lock loop includes an input terminal 2 for receiving an RF input signal $V_i$, for example, a mixer 4, an I-F amplifier 6, a limiter 8, an I-F reference oscillator 10, a phase detector 12, a loop filter 14, a voltage controlled oscillator (VCO) 16, and a multiplier/divider 18. The I-F substitution loop includes a summing junction 20, an I-F amplifier 22, a synchronous detector 24, and an output terminal 26 for providing an output signal voltage, $V_o$. Only a general description of the operation of the VM-24 circuitry as shown in FIG. 1 will be given herein.

An RF signal $V_i$ is mixed with the signal derived from the multiplier/divider 18, via the mixer 4, for producing an intermediate frequency (I-F) representation $V_{IF}$ of the input signal $V_i$. The I-F signal $V_{IF}$ is amplified, via the amplifier 6 and fed to both the summing junction 20 of the I-F substitution loop 3 and to the limiter 8. The output of the limiter 8 is fed to a phase detector 12 for phase detecting with a signal from an I-F reference oscillator 10, to provide a signal to the loop filter 14 representative of the instantaneous phase error of the I-F signal $V_{I-F}$. The filtered signal is coupled from the loop filter 14 to the voltage controlled oscillator 16 for converting the signal from the loop filter 14 back into an AC signal. The output signal from the VCO 16 is fed to the multiplier/divider 18 for adjusting the frequency range thereof, whereby the output of the multiplier/divider 18 is then fed to the mixer 4. In the I-F substitution loop 3, the I-F signal $V_{I-F}$ derived from the phase lock loop 1 is summed at the summing junction 20 with a substitution signal $V_{sub}$, and amplified, via another I-F amplifier 22. The amplified output signal from I-F amplifier 22 is provided to a synchronous detector 24 driven by an AC reference voltage $V_{ref}$, for providing an output signal $V_o$ that is a DC representation of the instantaneous level of the sum of the I-F signal $V_{IF}$ and the I-F substitution signal $V_{sub}$. The level of the I-F substitution signal $V_{sub}$ is adjusted such that the synchronous detector output $V_O$ becomes zero. The signal $V_{sub}$ is then equal to $-V_{IF}$. The substitution signal $V_{sub}$ is generated by a precision variable attenuator so the level of $V_{sub}$ is precisely known. The level of the I-F signal $V_{IF}$ is thus also precisely known and since the input signal $V_{in}$ is analgous to the I-F signal, the level of the input signal is also known. When the input signal $V_i$ is very low, the phase detector 12 input signal consists of the limited I-F signal from limiter 8 and noise. The noise at this point is primarily white noise, but the phase detector 12 converts this white noise to phase noise. As a consequence, the output signal from the VCO 16 contains level dependent phase noise side bands. To extend the range of level detecting of the VM-24, the phase noise must be reduced.

Figure 2:
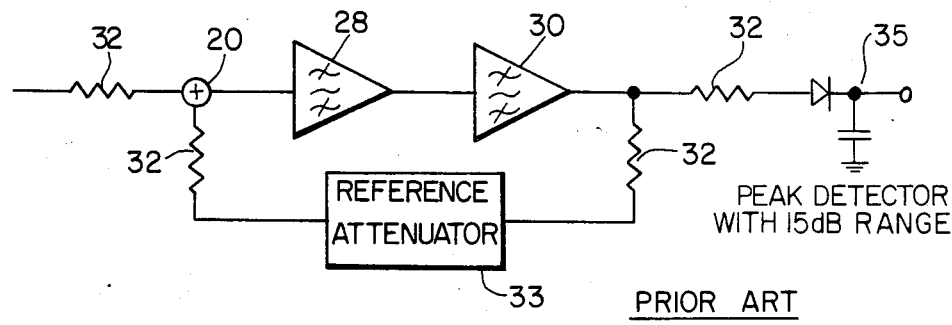
FIG. 2 shows the use of two tuned amplifiers in a feedback loop in the I-F substitution loop of the VM-24.

The output $V_O$ of the syncronous detector is connected to an integrator 70 which controls the level of an oscillator 74, 76 which generates the substitution voltage $V_{sub}$. The combination of the synchronous detector, the integrator and the variable output oscillator acts as a very narrow bandwidth bandpass filter 30. The output of the narrowband bandpass filter 30 is then connected to the summing junction 20 thru a reference attenuator 33. A conventional tuned amplifier 28 is also provided to minimize effects due to DC offsets in the syncronous detector 24 that is part of the narrowband amplifier 30. The I-F substitution loop shown in FIG. 2 will then act as a feedback amplifier with the bandwidth controlled by the narrowband amplifier 20 and the gain is set by the highly stable reference attenuator 33. The attenuation of the reference attenuator is controlled in 10 dB steps such that the output voltage of the I-F substitution loop is always within a 15 dB range which is detected in a conventional peak detector 35. A major problem with the loop is that the bandwidth is set by the second narrowband amplifier 30. The summing junction 20 will act as a virtual ground (i.e. 0 volts) only within the bandwidth of the narrowband amplifier 30 which is much less than the bandwidth of the conventional tuned amplifier 28. Noise which is outside the bandwidth of the narrowband amplifier 30 will be amplified by the tuned amplifier 28 which will overload the output of amplifier 28.

Figure 3:
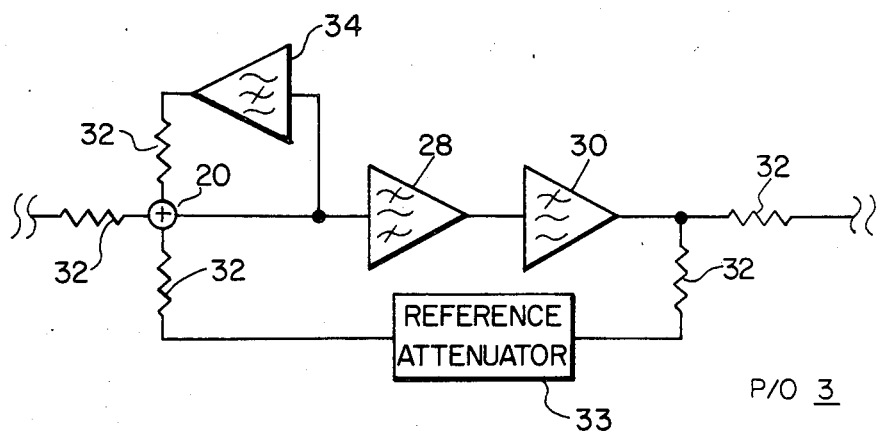
FIG. 3 shows the insertion of a second loop in parallel with the standard I-F substitution loop shown in FIG. 2 for increasing the bandwidth of the virtual ground, and represents a first embodiment of the instant invention.
Figure 4:
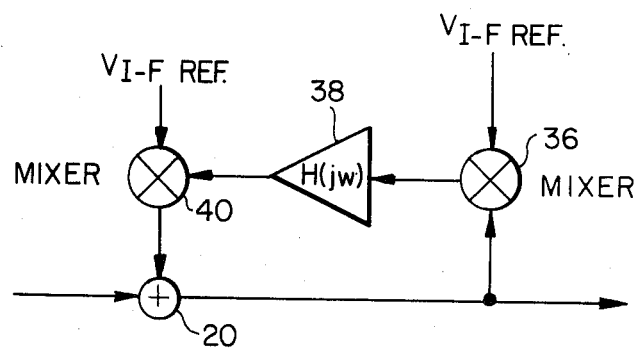
FIG. 4 shows a practical realization of the second loop of FIG. 3.

It was discovered that further noise reduction, for increasing the bandwidth of the virtual ground at the summing junction 20, is provided by inserting a "second loop" in parallel with the standard I-F substitution loop 3, as shown in FIG. 3. As shown, in simplified form, the second loop includes another tuned amplifier 34, and another summing resistor 32 for coupling the output of the second loop amplifier 34 to the summing junction 20 In general, the second loop suppresses noise at the summing junction 20 by a factor equivalent to the gain of the second loop. To insure that the I-F signal is unchanged by the insertion of the new or second loop 34, 32, the gain of the second loop 32, 34, is set to be zero at the I-F frequency. A practical realization of the noise suppression or second loop 32, 34, is shown in FIG. 4, where a mixer 36 is included for translating the I-F signal to DC; the amplifier 38 is designed to provide a transfer function for bandpass filtering the DC signal from the mixer 36, and a mixer 40 is provided for converting back to the I-F frequency the bandpass filtered signal from amplifier 38. The transfer function H(jw) for amplifier 38 has a first order bandpass characteristic, and is given below in equation 1:

$$H(jw) = -g_n \cdot \frac{j \cdot f/f_c}{(1 + j \cdot f/f_c)(1 + j \cdot f/f_h)} ;$$

where $g_n$ is the loop gain, $f_c$ and $f_h$ are the lower and upper cutoff frequencies, respectively, and f is an offset from the I-F frequency.

Figure 5:
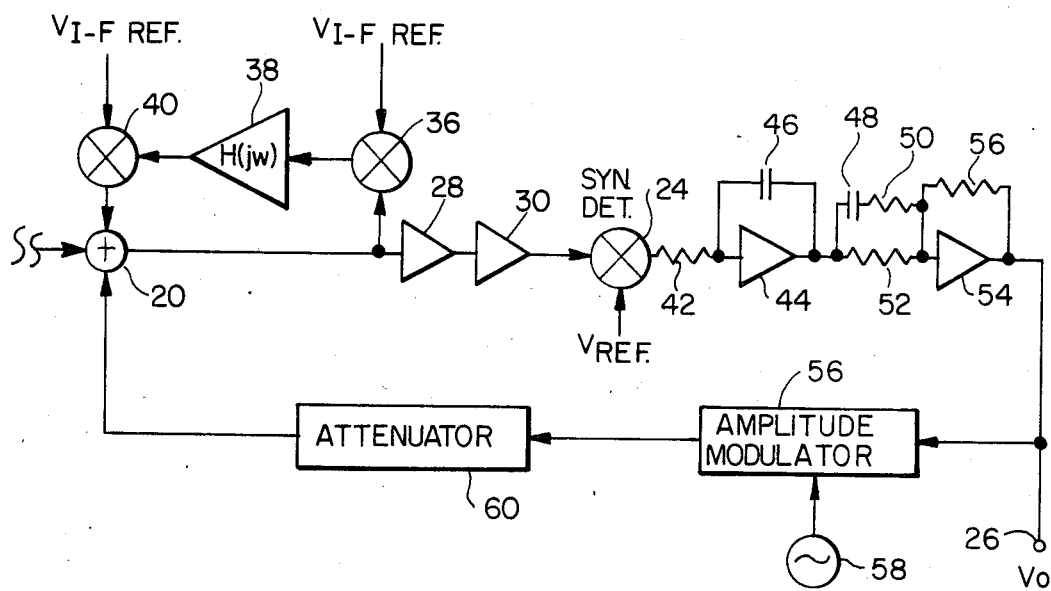
FIG. 5 shows another embodiment of the invention for the I-F substitution loop including stability compensation, and the second loop for noise suppression.

In order to further improve the circuit for providing higher phase margin, the I-F substitution loop 3 was further improved, via the embodiment shown in FIG. 5. As shown, an integrator amplifier circuit 42, 44, 46, has been added, in addition to an output amplifier 54, all after the synchronous detector 24. Stability compensation is provided by the series RC circuit including a capacitor 48 and a resistor 50. This compensation is of course operating in combination with summing resistor 52 and feedback resistor 56 around output amplifier 54. Another modification includes the amplitude modulator 56 for modulating the output signal $V_o$ with a reference signal 58, and feeding the modulated signal to an attenuator 60, for coupling to the summing junction 20. Although the embodiment of FIG. 5 was found to be an improvement in extending the detection of the VM-24, further improvement was obtained, via the circuit shown in FIG. 6, which is described below.

Figure 6:
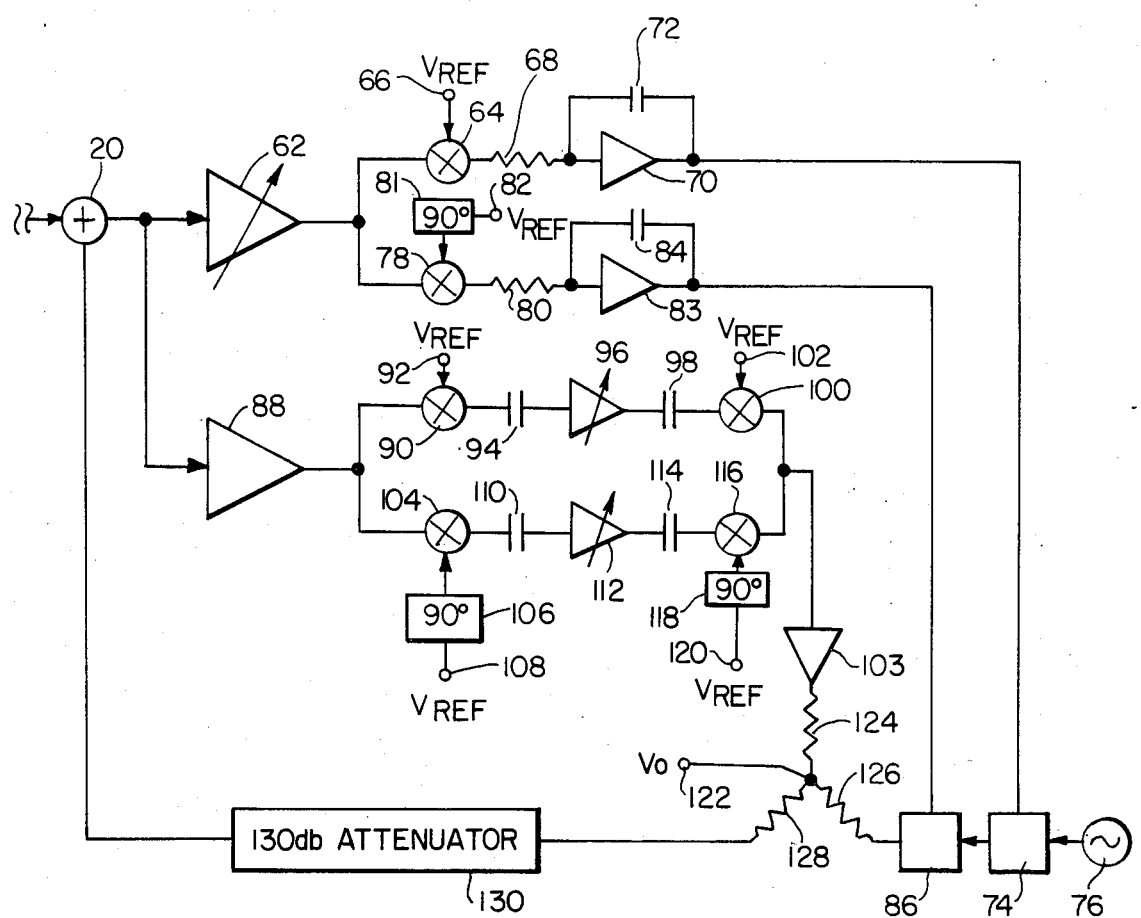
FIG. 6 shows yet another embodiment of the invention, wherein in the I-F substitution loop and in the second parallel loop, various elements are connected in quadrature with one another.

As shown in FIG. 6, another embodiment of the invention includes utilization of in-phase and quadrature channels in the I-F substitution loop, and in the parallel or second loop, as will be described hereinafter in detail. The I-F substitution loop includes a tuned amplifier 62, an in-phase channel including a product detector 64 having a terminal 66 for receiving a reference voltage $V_{ref}$, a summing resistor 68 for coupling the output of mixer 64 to an integrating amplifier 70 including an integrating capacitor 72, and a modulator 74 for amplitude modulating a signal from signal generator 76 by the integrated output signal from amplifier 70. The quadrature channel of the I-F substitution loop includes a mixer 78, a 90 degree phase shifter 81, a terminal 82 for receiving the reference signal $V_{ref}$, a summing resistor 80 for coupling the output of the product detector 78 to an integrator consisting of an amplifier 83 and integrating capacitor 84, and a phase shifter 86 for phase shifting the modulated signal from modulator 74 with the output signal from integrating amplifier 83. The new or second loop includes an input amplifier 88 for driving an in-phase channel including a product detector 90 having a terminal 92 for receiving a reference voltage $V_{ref}$, a capacitor 94 for coupling the output from mixer 90 to a tuned amplifier 96, another coupling capacitor 98 for coupling the output from tuneable amplifier 96 to a mixer 100 including a terminal 102 for receiving a reference voltage $V_{ref}$, and an output amplifier 103 for receiving the output signal from mixer 100. The quadrature channel of the second loop or parallel loop includes another mixer 104, a 90 degree phase shifter 106 receiving a reference voltage $V_{ref}$ at terminal 108, a coupling capacitor 110 for coupling the output signal from product detector 104 to a tuneable amplifier 112. The output of the tuneable amplifier 112 is coupled via capacitor 114 to mixer 116. Mixer 116 includes a 90 degree phase shifter 118 having a terminal 120 for receiving a reference signal $V_{ref}$. The output signal from mixer 116 is summed with the output signal from mixer 100, via output amplifier 103. The output signal from amplifier 103 is coupled to an output terminal 122, via resistor 124. Another resistor 126 couples the output signal from modulator 86 to output terminal 122. Another resistor 128 couples the signal developed at terminal 122 to an attenuator 130, and the output of the attenuator 130 is fed back to the summing junction 20. Circuitry for the product detectors 64, 78, 90, 104, and mixers 102, 116, and amplitude modulators 74 and 86, are similar to circuitry disclosed in MOTOROLA Application Note AN-531, "MC 1596 Balanced Modulator". Also, it was found that the output amplifier 103 can practically be provided by a circuit (not shown) including an isolation amplifier driving a complementary emitter follower with an RC feedback network coupled between the output of the complementary emitter follower and the input of the isolation amplifier. By providing summing resistors from the mixers 100 and 116, respectively, to the input terminal in the isolation amplifier a virtual ground is created at that input point, thereby providing the necessary gain for the output amplifier 103. Also, broader bandwidth can be obtained by eliminating the summing resistors and directly coupling, via coupling capacitors, the outputs of the multipliers 100 and 116 to the summing junction of amplifier 103.

Figure 7:
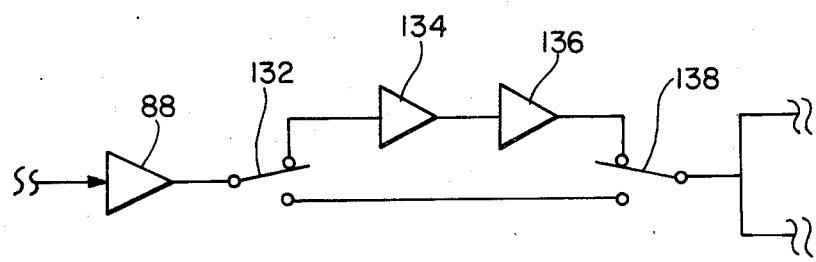
FIG. 7 shows a simplified schematic diagram of an input amplifier configuration for the second parallel loop for permitting selective gain control of the loop, and represents another element of the invention.

The input amplifier 88 must be low noise and provide at least 20 dB gain. Through experimentation it was determined that a low frequency mixer preamplifier having a transformer coupled input met this requirement. Also, the circuit of FIG. 7 was implemented for providing a gain change in the noise suppression or second loop. As shown in FIG. 7, the output of input amplifier 88 is coupled via a transistorized switching circuit 132, (shown for simplification purposes as a single-pole double-throw switch 132) to cascaded amplifiers 134 and 136; the output of amplifier 136 being connected by another transistorized switch 138 to the in-phase and quadrature channels of the noise suppression loop. Typically, the gains of amplifiers 88, 134 and 136 are each set at 20 db. Accordingly, through the use of transistor switches 132 and 138 the input amplification of the noise suppression loop can be selectively changed from 20 db to 60 db.

Figure 8:
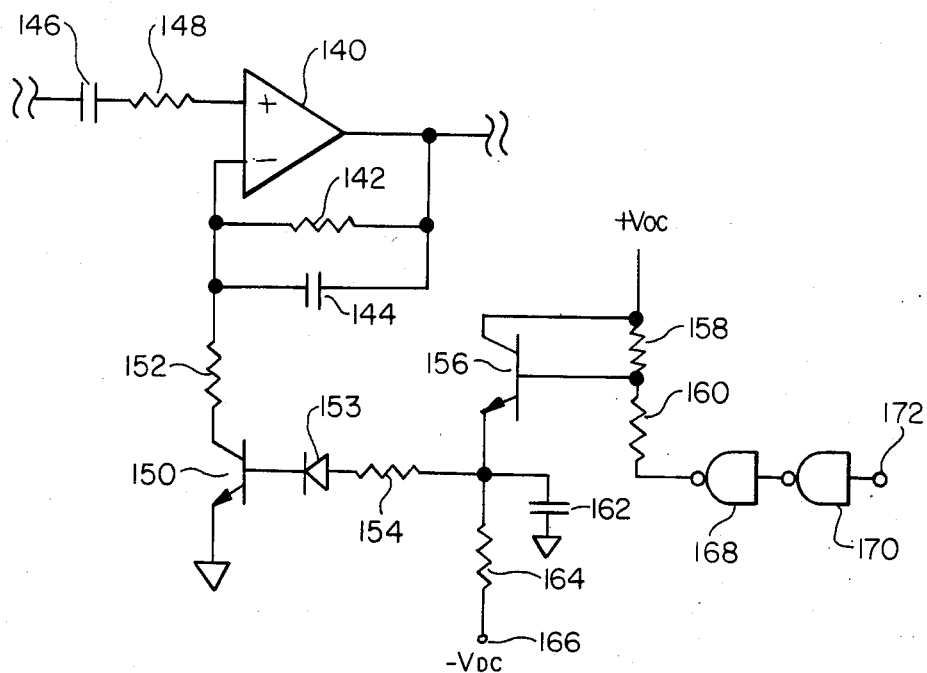
FIG. 8 shows a schematic circuit diagram for a variable gain low-frequency switching amplifier for use in the present invention.

Each one of the tuneable amplifiers 96 and 112 of the in-phase and quadrature channels, respectively, of the noise suppression loop, can be provided by the low frequency variable gain amplifier circuit shown in FIG. 8. The amplifier 140 is a wide bandwidth operational amplifier such as a NATIONAL LM 318. Amplifier 140, as shown in FIG. 8, is wired as a voltage follower, via feedback resistor 142, compensation capacitor 144 and an input coupling network which includes capacitor 146 and input resistor 148, thereby permitting grounded switches to be used to change the gain of the amplifier configuration. A transistor 150 is coupled by collector resistor 152 to the non-inverting terminal of amplifier 140 for providing the gain switching of the amplifier. The NPN transistor switch 150 is driven by the other circuitry shown including a blocking diode 153, a resistor 154, an NPN switching transistor 156, a collector-base resistor 158, an input resistor 160, a filter capacitor 162 and a pull down resistor 164 connected, via terminal 166, to a DC voltage $-V_{DC}$. The collector of transistor 156 is connected to a positive DC voltage, $+V_{DC}$. A pair of NAND gates 168 and 170 are connected between an input terminal 172 and base resistor 160 for providing, in response to a switching signal applied to terminal 172, a positive signal at the base of transistor 156, to turn on that transistor and apply the positive DC voltage to the base of transistor 150, via resistor 154 and blocking diode 152, for in turn turning on transistor 150 to connect resistor 152 to ground, thereby changing the gain of amplifier 140 in a selective manner.

Figure 9:
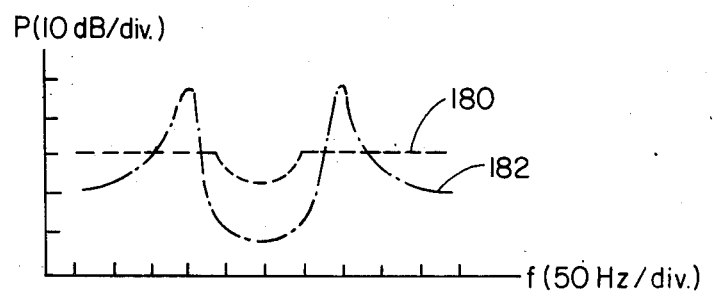
FIG. 9 shows noise spectrum curves for comparing operation of the signal generator with and without noise compression in the I-F substitution loop.

FIG. 9 shows the noise spectrum at the output of the main loop I-F amplifier 6, occuring at the summing junction 20. Curve 180 shows the noise spectrum for the narrow band phase lock loop without noise suppression, and curve 182 shows the noise spectrum for the phase lock loop including the noise suppression circuitry substantially as described in FIGS. 6 through 8.

Although various embodiments of the present invention have been illustrated in use with an I-F substitution loop, it is possible that the principle of using a loop amplifier having a predetermined transfer characteristic in parallel with a summing junction for reducing noise at the summing junction may be useful in applications other than I-F substitution loops. Also, other advantages and uses of the present invention may occur to those skilled in the art which fall within the scope and spirit of the following claims.

What is claimed is:

1. A noise reduction circuit for use with an I-F substitution loop comprising
   an I-F substitution loop having a summing junction,
   a source of I-F signals, having side band frequencies and an I-F frequency,
   a source of a substitution signal,
   means supplying both said signals to said summing junction,
   amplification loop means for transforming and amplifying a signal at said summing junction and feeding back to the summing junction an amplified and transformed signal produced by said amplification loop means,
   said amplification loop means including
   first amplifier means for receiving as an input signal the signal at said summing junction, and providing a first DC output signal bandpass filtered to provide a pass band at the side band frequencies and a stop band at the I-F frequency,
   second amplifier means connected in a quadrature with said first amplifier means for receiving as an input signal the signal at said summing junction, and providing a second DC output signal bandpass filtered to provide a pass band at the side band frequencies and a stop band at the I-F frequency,
   means applying said first and second output signals to said summing junction,
   third amplifier means for receiving as input signals and summing together said first and second output signals for providing at an output terminal a third output signal, and
   means for connecting said third output signal to said summing junction.

2. The noise reduction means of claim 1, wherein said amplification loop means includes:
   translating means for converting said I-F signal to a DC voltage;
   first amplifier means having a bandpass characteristic for providing zero gain at the I-F frequency, for bandpass filtering said DC voltage translation of said I-F signal and providing the filtered voltage as an output signal;
   mixer means for converting said bandpassed filtered DC signal from said first amplifier means, and converting said signal back to an AC signal at the I-F frequency.

3. The noise reduction means of claim 1 further including isolation amplifier means for receiving as an input signal the signal at said summing junction, and providing an output signal representation thereof as said input signals to said first and second amplifier means.

4. The noise reduction means of claim 1, wherein said first amplifier means includes:
   first product detector means for receiving and instantaneously converting the signal at said summing junction signal to a first DC voltage;
   first amplifier means for receiving and bandpass filtering said first DC voltage instantaneous representation of said summing junction signal, and providing the same as an output signal; and
   first mixer means for receiving as an input signal the output signal from said first amplifier means, and converting this signal into an AC signal at the I-F frequency, the latter being said first output signal.

5. The noise reduction means of claim 4, wherein said second amplifier means includes:
   second product detector means for receiving and instantaneously converting the signal at said summing junction signal to a second DC voltage, said second product detector means operating in quadrature relative to said first product detector means;
   second amplifier means for receiving and bandpass filtering said second DC voltage instantaneous representation of said summing junction signal, and providing the same as an output signal; and
   second mixer means for receiving as an input signal the output signal from said second amplifier means, for converting this signal into an AC signal at the I-F frequency, the latter being said second output signal, said second mixer means operating in quadrature with said first mixer means.

6. The noise reduction means of claim 5, wherein said first and second amplifier means each have a transfer function H(jw) as indicated below for providing desired bandpass characteristics and substantially zero gain at the I-F frequency:

$$H(jw) = -g_n \cdot \frac{j \cdot f/f_e}{(1 + j \cdot f/f_e)(1 + j \cdot f/f_h)} ;$$

where $g_n$ is the loop gain, $f_e$ and $f_h$ are the lower and upper cutoff frequencies, and f is an offset from the I-F frequency.

* * * * *